United States Patent
Jelinek et al.

(10) Patent No.: US 12,438,002 B2
(45) Date of Patent: Oct. 7, 2025

(54) SEMICONDUCTOR DEVICE INCLUDING A FIELD STOP REGION

(71) Applicant: Infineon Technologies AG, Neubiberg (DE)

(72) Inventors: Moriz Jelinek, Villach (AT); Thomas Waechtler, Chemnitz (DE); Bernd Bitnar, Bannewitz (DE); Daniel Schloegl, Villach (AT); Hans-Joachim Schulze, Taufkirchen (DE); Oana Julia Spulber, Neubiberg (DE); Benedikt Stoib, Feldkirchen-Westerham (DE); Christian Krueger, Liegau-Augustusbad (DE)

(73) Assignee: Infineon Technologies AG, Neubiberg (DE)

( * ) Notice: Subject to any disclaimer, the term of this patent is extended or adjusted under 35 U.S.C. 154(b) by 372 days.

(21) Appl. No.: 17/837,690

(22) Filed: Jun. 10, 2022

(65) Prior Publication Data

US 2022/0406600 A1   Dec. 22, 2022

(30) Foreign Application Priority Data

Jun. 18, 2021   (DE) .......................... 102021115825.7

(51) Int. Cl.
*H01L 21/22*   (2006.01)
*H01L 21/265*   (2006.01)
(Continued)

(52) U.S. Cl.
CPC ...... *H01L 21/221* (2013.01); *H01L 21/26526* (2013.01); *H01L 21/26586* (2013.01);
(Continued)

(58) Field of Classification Search
CPC ............. H01L 21/221; H01L 21/26526; H01L 21/26586; H01L 29/0638; H01L 29/0834;
(Continued)

(56) References Cited

U.S. PATENT DOCUMENTS

| | | | |
|---|---|---|---|
| 2002/0117712 A1* | 8/2002 | Matsudai | H10D 12/032 257/E21.384 |
| 2014/0299915 A1* | 10/2014 | Kouno | H10D 62/53 257/139 |

(Continued)

FOREIGN PATENT DOCUMENTS

| | | |
|---|---|---|
| DE | 102011113549 A1 | 3/2013 |
| DE | 102015107085 A1 | 11/2016 |

(Continued)

*Primary Examiner* — Julio J Maldonado
*Assistant Examiner* — Paul A Berry
(74) *Attorney, Agent, or Firm* — Murphy, Bilak & Homiller, PLLC (57) ABSTRACT

A semiconductor device includes: an n-doped drift region between first and second surfaces of a semiconductor body; a p-doped first region at the second surface; and an n-doped field stop region between the drift and first region. The field stop region includes first and second sub-regions with hydrogen related donors. A p-n junction separates the first region and first sub-region. A concentration of the hydrogen related donors, along a first vertical extent of the first sub-region, steadily increases from the pn-junction to a maximum value, and steadily decreases from the maximum value to a reference value at a first transition between the sub-regions. A second vertical extent of the second sub-region ends at a second transition to the drift region where the concentration of hydrogen related donors equals 10% of the reference value. A maximum concentration value in the second sub-region is at most 20% larger than the reference value.

24 Claims, 4 Drawing Sheets

(51) Int. Cl.
  *H10D 12/00* (2025.01)
  *H10D 12/01* (2025.01)
  *H10D 62/10* (2025.01)
  *H10D 62/13* (2025.01)
  *H10D 62/17* (2025.01)
  *H10D 62/53* (2025.01)

(52) U.S. Cl.
  CPC ......... *H10D 12/038* (2025.01); *H10D 12/481* (2025.01); *H10D 62/112* (2025.01); *H10D 62/142* (2025.01); *H10D 62/393* (2025.01); *H10D 62/53* (2025.01)

(58) Field of Classification Search
  CPC ................. H01L 29/1095; H01L 29/32; H01L 29/66348; H01L 29/7397; H01L 21/761; H01L 29/0615; H01L 29/7393; H01L 29/0619; H01L 29/0878; H01L 29/8611; H01L 29/0649; H01L 29/417; H01L 29/41775; H01L 29/0821; H01L 21/3215; H01L 29/66333; H01L 29/66334; H02M 7/537; C30B 15/04
  See application file for complete search history.

(56) References Cited

U.S. PATENT DOCUMENTS

2018/0122895 A1\* 5/2018 Jelinek ................ H01L 21/3242
2023/0041042 A1\* 2/2023 Yaguchi ............... H10D 12/481

FOREIGN PATENT DOCUMENTS

DE 112015006059 T5 10/2017
DE 102017117999 A1 2/2019

\* cited by examiner

SEMICONDUCTOR DEVICE INCLUDING A FIELD STOP REGION

TECHNICAL FIELD

The present disclosure is related to a semiconductor device, in particular to a semiconductor device including a field stop region.

BACKGROUND

Technology development of new generations of semiconductor devices, e.g. diodes or insulated gate field effect transistors (IGFETs) such as metal oxide semiconductor field effect transistors (MOSFETs) or insulated gate bipolar transistors (IGBTs), aims at improving electric device characteristics and reducing costs by shrinking device geometries. Although costs may be reduced by shrinking device geometries, a variety of tradeoffs and challenges have to be met when increasing device functionalities per unit area. For example, a thickness reduction of the semiconductor body may be beneficial with respect to reduction of static and dynamic electric losses. Thickness reduction, however, typically comes at the cost of e.g. breakdown voltage and cosmic ray performance. Semiconductor devices may therefore include a rather deep field stop region for providing sufficient softness during electric switching. The field stop region aims at protecting a certain amount of charge carrier plasma so that these charges can carry the load current during an end of reverse recovery. By avoiding punch-through the field stop region may allow for increasing the maximum electric field at a given applied reverse bias voltage (at the same total chip thickness) when comparing to a semiconductor device without a field stop region or a very shallow field stop region. A higher electric field may decrease the breakdown voltage and increase cosmic ray failure in time (FIT) rate.

There may be a desire for improving a semiconductor device for enabling sufficient softness during switching without increasing the chip thickness.

SUMMARY

An example of the present disclosure relates to a semiconductor device. The semiconductor device includes an n-doped drift region arranged between a first surface and a second surface of a semiconductor body. The semiconductor device further includes a p-doped first region arranged at the second surface. The semiconductor device further includes an n-doped field stop region arranged between the drift region and the first region. The field stop region includes a first sub-region and a second sub-region. A p-n junction separates the first region and the first sub-region. Hydrogen related donors are included in the first sub-region and in the second sub-region. A concentration of the hydrogen related donors, along a first vertical extent of the first sub-region, steadily increases from the pn-junction to a maximum value, and steadily decreases from the maximum value to a reference value at a first transition between the first sub-region to the second sub-region. A second vertical extent of the second sub-region ends at a second transition to the drift region where the concentration of the hydrogen related donors equals 10% of the reference value. A maximum concentration value in the second sub-region is at most 20% larger than the reference value. In some embodiments, the maximum concentration value in the second sub-region is smaller than the reference value.

Another example of the present disclosure relates to a semiconductor device. The semiconductor device includes an n-doped drift region arranged between a first surface and a second surface of a semiconductor body. The semiconductor device further includes a p-doped first region arranged at the second surface. The semiconductor device further includes an n-doped field stop region arranged between the drift region and the first region. The field stop region includes a first sub-region and a second sub-region. A p-n junction separates the first region and the first sub-region. Hydrogen related donors are included in the first sub-region and in the second sub-region. A concentration of the hydrogen related donors, along a first vertical extent of the first sub-region, steadily increases from the pn-junction to a maximum value, and steadily decreases from the maximum value to a reference value at a first transition between the first sub-region to the second sub-region. A second vertical extent of the second sub-region ends at a second transition to the drift region where the concentration of the hydrogen related donors equals 10% of the reference value. A maximum value of a vertical gradient of a log-linear graph in which the ordinate is a non-linear logarithmic scale of the concentration of the hydrogen related donors and the abscissa is a linear scale of a depth along a vertical direction, is at least three times larger in the first sub-region than in the second sub-region. Alternatively or additionally, a maximum positive value of a vertical gradient of a log-linear graph in which the ordinate is a non-linear logarithmic scale of the concentration of the hydrogen related donors and the abscissa is a linear scale of a depth along a vertical direction, is at least three times larger in the first sub-region than in the second sub-region.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the embodiments and are incorporated in and constitute a part of this specification. The drawings illustrate examples of semiconductor devices and together with the description serve to explain principles of the examples. Further examples are described in the following detailed description and the claims.

DETAILED DESCRIPTION

In the following detailed description, reference is made to the accompanying drawings, which form a part hereof and in which are shown by way of illustrations specific examples in which semiconductor substrates may be processed. It is to be understood that other examples may be utilized and structural or logical changes may be made without departing from the scope of the present disclosure. For example, features illustrated or described for one example can be used on or in conjunction with other examples to yield yet a further example. It is intended that the present disclosure includes such modifications and variations. The examples are described using specific language, which should not be construed as limiting the scope of the appending claims. The drawings are not scaled and are for illustrative purposes only. Corresponding elements are designated by the same reference signs in the different drawings if not stated otherwise.

The terms "having", "containing", "including", "comprising" and the like are open, and the terms indicate the presence of stated structures, elements or features but do not preclude the presence of additional elements or features. The articles "a", "an" and "the" are intended to include the plural as well as the singular, unless the context clearly indicates otherwise.

The term "electrically connected" describes a permanent low-resistive connection between electrically connected elements, for example a direct contact between the concerned elements or a low-resistive connection via a metal and/or heavily doped semiconductor material. An ohmic contact is a non-rectifying electrical junction.

Ranges given for physical dimensions include the boundary values. For example, a range for a parameter y from a to b reads as a≤y≤b. The same holds for ranges with one boundary value like "at most" and "at least".

The term "on" is not to be construed as meaning only "directly on". Rather, if one element is positioned "on" another element (e.g., a layer is "on" another layer or "on" a substrate), a further component (e.g., a further layer) may be positioned between the two elements (e.g., a further layer may be positioned between a layer and a substrate if the layer is "on" said substrate).

An example of a semiconductor device may include an n-doped drift region arranged between a first surface and a second surface of a semiconductor body. The semiconductor device may further include a p-doped first region arranged at the second surface. The semiconductor device further may further include an n-doped field stop region arranged between the drift region and the first region. The field stop region may include a first sub-region and a second sub-region. A p-n junction may separate the first region and the first sub-region. Hydrogen related donors are included in the first sub-region and in the second sub-region. A concentration of the hydrogen related donors, along a first vertical extent of the first sub-region, may steadily increase from the pn-junction to a maximum value, and may steadily decrease from the maximum value to a reference value at a first transition between the first sub-region to the second sub-region. A second vertical extent of the second sub-region may end at a second transition to the drift region where the concentration of the hydrogen related donors equals 10% of the reference value. Alternatively, the second vertical extent of the second sub-region may end at a depth where the concentration of the hydrogen related donors falls below a donor concentration of the drift region. The donor concentration of the drift region may be a background doping concentration of a silicon semiconductor substrate or an epitaxial layer deposited on a substrate, for example. A maximum concentration value in the second sub-region may be at most 20%, or at most 15%, or at most 10% larger than the reference value.

For example, in a depth interval starting at a depth 1 μm before the first transition and ending at a depth 1 μm after the first transition, a vertical gradient of the concentration of the hydrogen related donors varies by at least a factor of 2, or by at least a factor of 4, or by at least a factor of 10. For example, at the first transition, a vertical gradient of the concentration of the hydrogen related donors varies by at least a factor of 2, or by at least a factor of 4, or by at least a factor of 10 over a vertical distance of 500 nm. For example, the concentration of the hydrogen related donors may exhibit a minimum or a saddle point at the first transition. Therefore, according to some embodiments, the gradient of the concentration of the hydrogen related donors may be zero at the first transition.

For example, the semiconductor device may be a trench transistor device or a planar transistor device with vertical current flow. The trench transistor device may be an insulated gate bipolar transistor (IGBT), for example.

The first surface may be a front surface or a top surface of the semiconductor device, and the second surface may be a back surface or a rear surface of the semiconductor device, for example. The semiconductor body may be attached to a lead frame via the second surface, for example. Over the first surface of the semiconductor body, bond pads may be arranged and bond wires may be bonded on the bond pads.

The semiconductor body may include or consist of a semiconductor material from the group IV elemental semiconductors, IV-IV compound semiconductor material, III-V compound semiconductor material, or II-VI compound semiconductor material. Examples of semiconductor materials from the group IV elemental semiconductors include, inter alia, silicon (Si) and germanium (Ge). Examples of IV-IV compound semiconductor materials include, inter alia, silicon carbide (SiC) and silicon germanium (SiGe). Examples of III-V compound semiconductor material include, inter alia, gallium arsenide (GaAs), gallium nitride (GaN), gallium phosphide (GaP), indium phosphide (InP), indium gallium nitride (InGaN) and indium gallium arsenide (InGaAs). Examples of II-VI compound semiconductor materials include, inter alia, cadmium telluride (CdTe), mercury-cadmium-telluride (CdHgTe), and cadmium magnesium telluride (CdMgTe).

For example, the semiconductor device may include transistor cells of a transistor cell array. The transistor cell array may be a 1-dimensional or 2-dimensional regular arrangement of a plurality of transistor cells. For example, the plurality of transistor cells of the transistor cell array may be electrically connected in parallel. For example, source or emitter regions of the plurality of transistor cells of an IGBT transistor cell array may be electrically connected together. Likewise, collector regions of the plurality of transistor cells of an IGBT transistor cell array may be electrically connected together. For example, gate electrodes of the plurality of transistor cells of an IGBT transistor cell array may be electrically connected together. A transistor cell of the transistor cell array or a part thereof, e.g. the gate electrode, may be designed in the shape of a stripe, a polygon, a circle or an oval, for example.

For example, the semiconductor device may include a first load electrode, e.g. a source or emitter electrode of an IGBT. The first load electrode may be a contact area and be formed by all or part of a wiring layer. For example, the wiring layer may correspond to one wiring level of a wiring area above the first surface, wherein the one wiring level of the wiring area may be located closest to the first surface in case of multiple wiring levels. The wiring area may include one or more than one, e.g. two, three, four or even more wiring levels. Each wiring level may be formed by a single one or a stack of conductive layers, e.g. metal layer(s). The wiring levels may be lithographically patterned, for example. Between stacked wiring levels, an interlayer dielectric may be arranged. Contact plug(s) or contact line(s) may be formed in openings in the interlayer dielectric to electrically connect parts, e.g. metal lines or contact areas, of different wiring levels to one another. For example, the contact area of the first load electrode may be electrically connected to a source or emitter region of each of the plurality of transistor cells in the semiconductor body by contact plugs arranged between the source region and the contact area of the first load electrode.

Similar to the first load electrode, a second load electrode, e.g. a collector electrode of an IGBT, may be a contact area and be formed by all or part of another wiring layer. For example, the other wiring layer may correspond to one wiring level of a wiring area above the second surface. Structural variations of the wiring area and/or the second load electrode over the second surface may be similar to the structural variations described above with respect to the wiring area and/or the first load electrode.

For example, the trench transistor device may be part of an integrated circuit, or a discrete transistor device. The trench transistor device may be a power trench transistor device, e.g. a vertical power trench transistor device having a load current flow between the first load electrode over the first surface of the semiconductor body and the second load electrode over the second surface. In the vertical transistor device, a load current may flow along the vertical direction perpendicular to the first and/or second surface. The transistor device may be configured to conduct currents of more than 1 A or more than 10 A or even more than 30 A. A number of transistor cells of the transistor cell array may depend on the maximum load current, for example. For example, a number of transistor cells of the transistor cell array may be larger than 100, or larger than 1000, or even larger than 10000, for example. The power transistor device may be further configured to block voltages between the load terminals, e.g. between emitter and collector of an IGBT of more than 10 V, 12 V, 60V, 100V, 400 V, 650V, 1.2 kV, 1.7 kV, 3.3 kV, 4.5 kV, 5.5 kV, 6 kV, 6.5 kV. The blocking voltage may correspond to a voltage class specified in a datasheet of the power transistor device, for example. The blocking voltage of the transistor device may be adjusted by an impurity concentration and/or a vertical extension of a drift region in the semiconductor body. A doping concentration of the drift region may gradually or in steps increase or decrease with increasing distance to the first main surface at least in portions of its vertical extension. According to other examples the impurity concentration in the drift region may be approximately uniform. For power transistors based on silicon, a mean impurity concentration in the drift region may be between $2 \times 10^{12}$ cm$^{-3}$ and $1 \times 10^{17}$ cm$^{-3}$, for example in a range from $5 \times 10^{12}$ cm$^{-3}$ to $1 \times 10^{15}$ cm$^{-3}$ or to $2 \times 10^{14}$ cm$^{-3}$. In some cases, the mean impurity concentration in the drift region for power transistors based on silicon may be in a range from $1 \times 10^{15}$ cm$^{-3}$ to $1 \times 10^{17}$ cm$^{-3}$. A vertical extension of the drift region may depend on voltage blocking requirements, e.g. a specified voltage class, of the vertical power transistor device. When operating the vertical power transistor device in voltage blocking mode, a space charge region may vertically extend partly or totally through the drift region depending on the blocking voltage applied to the vertical power transistor device. When operating the vertical power transistor device at or close to the specified maximum blocking voltage, the space charge region may reach or penetrate into the field stop region that is configured to prevent the space charge region from further reaching to a backside emitter and a collector contact at the second main surface of the semiconductor body. For IGBTs, in this manner, the drift region may be formed using desired low doping levels and with a desired thickness while achieving soft switching.

For example, the p-doped first region may be a collector or a rear side emitter region. The p-doped first region may directly adjoin to the second load electrode at the second surface of the semiconductor body, for example. A maximum doping concentration of the p-doped first region may be larger than the maximum value in the first sub-region, for example. In some embodiments, the p-doped first region may be intermitted by one or more n-doped regions also arranged at the second surface.

The p-n junction between the first region and the first sub-region may be shaped at least partly as a plane that is at least substantially parallel to the second surface, for example.

The semiconductor device including the field stop region including the first and second sub-regions described above allows for a number of technical benefits when shrinking device dimensions. For example, sensitivity of field stop doping profiles with respect to variations of oxygen and carbon impurities in the wafer base material, e.g. CZ or in particular MCZ crystalline silicon, may be reduced by avoiding pronounced minima in the field stop profile, because in the region of the minima the sensitivity against the formation of donor-like carbon-oxygen-hydrogen complexes is high. Moreover, the dynamic characteristics of the semiconductor device, e.g. softness or dU/dt or dI/dt-characteristics, may be improved by reducing the waviness of the doping profile of the field stop region including hydrogen-related donors.

Structural and functional details described with regard to features of the semiconductor device above may likewise apply to the corresponding features related to the examples below.

Another example of a semiconductor device may include an n-doped drift region arranged between a first surface and a second surface of a semiconductor body. The semiconductor device may further include a p-doped first region arranged at the second surface. The semiconductor device further may further include an n-doped field stop region arranged between the drift region and the first region. The field stop region may include a first sub-region and a second sub-region. A p-n junction separates the first region and the first sub-region. Hydrogen related donors are included in the first sub-region and in the second sub-region. A concentration of the hydrogen related donors, along a first vertical extent of the first sub-region, may steadily increase from the pn-junction to a maximum value, and may steadily decrease from the maximum value to a reference value at a first transition between the first sub-region to the second sub-region. A second vertical extent of the second sub-region may end at a second transition to the drift region where the concentration of the hydrogen related donors equals 10% of the reference value. A maximum value of a vertical gradient of a log-linear graph in which the ordinate is a non-linear logarithmic scale of the concentration of the hydrogen related donors and the abscissa is a linear scale of a depth along a vertical direction, is at least three times larger in the first sub-region than in the second sub-region. In other exemplary embodiments, the maximum value of said vertical gradient may be at least two times, or at least four times, or at least six times or even at least ten times larger in the first sub-region than in the second sub-region.

The above-mentioned abscissa may be defined as follows: The depth scale may be oriented from the second surface, e. g. a backside of the semiconductor device, towards the first surface, e. g. a frontside of the semiconductor device. In other words, with increasing distance from the second surface, e. g. the backside of the semiconductor device, the depth according to the abscissa may increase. Both, the first and the second sub-region may be arranged with greater distance to the second surface than to the first surface, e. g. first and the second sub-region may be arranged closer to the backside than to the frontside of the semiconductor device. Therefore, the vertical gradient may exhibit positive values where, moving along the abscissa from a position of the second surface towards a position of the first surface, the graph representing the concentration of the hydrogen related donors is increasing.

The vertical gradient exhibits, for example, positive values in the first vertical extent of the first sub-region. In particular, the vertical gradient may exhibit a relative or even a global maximum within the first vertical extent of the first sub-region. The vertical gradient exhibits, for example, positive values and/or negative value in the second sub-region. Compared to all values of the vertical gradient within the second sub-region the value relative or global maximum of the vertical gradient within the first vertical extent of the first sub-region may be at least two times, at least three times, at least four times or at least six times or even at least ten times larger. In another embodiment, a maximum value of the vertical gradient in the first sub-region is at least three times larger than every value of said gradient in the second sub-region, the vertical gradient being the gradient of a log-linear graph in which the ordinate is a non-linear logarithmic scale of the concentration of the hydrogen related donors and the abscissa is a linear scale of a depth along a vertical direction. The sign of the gradient may be regarded, when comparing the values of the gradient. Of course, when regarding the sign, a positive value is always larger by any factor than any negative values. Therefore in some embodiments, a maximum value of the vertical gradient in the first sub-region is at least three times larger than every positive value of said gradient in the second sub-region.

For example, in a depth interval starting at a depth 1 µm before the first transition and ending at a depth 1 µm after the first transition, a vertical gradient of the concentration of the hydrogen related donors varies by at least a factor of 2, or by at least a factor of 4, or by at least a factor of 10. For example, at the first transition, the vertical gradient of the concentration of the hydrogen related donors varies by at least a factor of 2, or by at least a factor of 4, or by at least a factor of 10 over a vertical distance of 500 nm. For example, the concentration of the hydrogen related donors may exhibit a minimum or a saddle point at the first transition. Therefore, according to some embodiments, the gradient of the concentration of the hydrogen related donors may be zero at the first transition.

For example, an average value of a vertical gradient of the log-linear graph from the pn-junction to the maximum value in the first sub-region may be at least three times larger than from the first transition to a peak in the second sub-region.

For example, the concentration of the hydrogen related donors decreases along at least 70%, or at least 80% of the second vertical extent. For example, at most two peaks and/or at most two minima may be included in the second sub-region.

For example, the vertical gradient of the log-linear graph within the second sub-region is smaller than $2 \times 10^{13}$ cm$^{-3}$/100 nm. For example, the vertical gradient does not exceed $2 \times 10^{13}$ cm$^{-3}$/100 nm within the second sub-region. Falling edges of the vertical gradient, e. g. at the second transition, may in contrast exhibit negative values, which, of course, are smaller than $2 \times 10^{13}$ cm$^{-3}$/100 nm regardless of a steepness of a falling slope. For example, all rising edges of the vertical gradient of the log-linear graph within the second sub-region are smaller than $2 \times 10^{13}$ cm$^{-3}$/100 nm. In an embodiment, the vertical gradient exhibits minor ripples within the second sub-region exceeding $2 \times 10^{13}$ cm$^{-3}$/100 nm. For example, in at least 90% or even 95% of the second sub-region, the vertical gradient may be smaller than $2 \times 10^{13}$ cm$^{-3}$/100 nm.

For example, a vertical profile of the concentration of the hydrogen related donors in the second sub-region may have 2 peaks. A concentration of the hydrogen related donors at a minimum between the two peaks may be at most 40%, or at most 35%, or at most 30% smaller than a concentration of the one of the two peaks that has the smaller peak concentration value. Being at most 30% or 20% smaller means, for example, that a difference is less than 30% or, respectively, 20%.

For example, a vertical profile of the concentration of the hydrogen related donors in the second sub-region may have a single peak. A concentration of the hydrogen related donors at a minimum between the single peak in the second sub-region and the maximum value in the first sub-region may be at most 30%, or at most 20% smaller than a concentration at the single peak.

For example, a vertical profile of the concentration of the hydrogen related donors in the second sub-region may steadily decrease from the first transition to the second transition. The second sub-region may be free of concentration peaks of the hydrogen related donors. Alternatively or additionally, the concentration of the hydrogen related donors may have its maximum value, within the second sub-region at the first transition. In other words, nowhere in the second sub-region, the concentration of hydrogen related donors may be larger than in the first transition.

For example, the first vertical extent may range between 15% and 200% or between 50% and 200% of the second vertical extent.

For example, a vertical distance between the p-n junction and a position of the maximum value may range between 0.5 µm and 4 µm, or between 0.5 µm and 3 µm, or between 0.5 µm and 2 µm. For example, a dose of electrically active hydrogen related donors between the p-n junction and a position of the maximum value may range between $1 \times 10^{11}$ cm$^{-2}$ and $2.5 \times 10^{12}$ cm$^{-2}$, or between $2 \times 10^{11}$ cm$^{-2}$ and $2.5 \times 10^{12}$ cm$^{-2}$.

For example, a vertical distance between the p-n junction and the second transition may range between 6 µm and 20 µm, or between 7 µm and 15 µm, or between 8 µm and 11 µm. For example, a dose of hydrogen related donors between the p-n junction and the second transition may range between $5 \times 10^{11}$ cm$^{-2}$ and $3.5 \times 10^{12}$ cm$^{-2}$, or between $1 \times 10^{12}$ cm$^{-2}$ and $3.5 \times 10^{12}$ cm$^{-2}$.

For example, a vertical distance between the p-n junction and a position of the maximum value may be smaller than a vertical distance between the position of the maximum value and the first transition.

For example, a ratio of the maximum value to a maximum concentration of the hydrogen related donors in the second sub-region may range from 3 to 50, or from 3 to 20.

For example, a ratio between a concentration of donors based on $C_iO_iH_n$ complexes to a total donor concentration along at least 80% of the second vertical extent is smaller than 0.1. By reducing the waviness of the doping profile of the field stop region, the sensitivity of field stop doping profiles with respect to variations of oxygen and carbon impurities in the wafer base material, e.g. CZ (Czochralski) silicon such as MCZ (magnetic CZ) crystalline silicon, may be reduced.

An example of a method of manufacturing the semiconductor device described as an example above may include forming the field stop region by ion implantation of protons based on one ion implantation energy or based on two different ion implantation energies. The protons may be implanted by at least two different implant angles, e.g. 2, or 4, or 8, or 16, or 32 different implant angles, for each ion implantation energy.

For example, a first implant angle for the ion implantation of protons may be smaller than a second implant angle for the ion implantation of protons. A first ion implantation dose of the protons implanted at the first implant angle may be smaller than a second ion implantation dose of the protons implanted at the second implant angle.

For example, an ion implantation dose of protons may increase with increasing implant angle for the at least two different implant angles.

For example, after the ion implantation of protons, hydrogen-related donors are electrically activated by annealing in a temperature range from 370° C. to 430° C., or from 380° C. to 400° C., or even more specific from 382° C. to 395° C.

The examples and features described above and below may be combined.

Functional and structural details described with respect to the examples above shall likewise apply to the exemplary examples illustrated in the figures and described further below.

In the following, further examples of semiconductor devices are explained in connection with the accompanying drawings. Functional and structural details described with respect to the examples above shall likewise apply to the exemplary embodiments illustrated in the figures and described further below. The conductivity type of the illustrated semiconductor regions may also be reversed, i.e. n-type being p-type and p-type being n-type.

Figure 1:
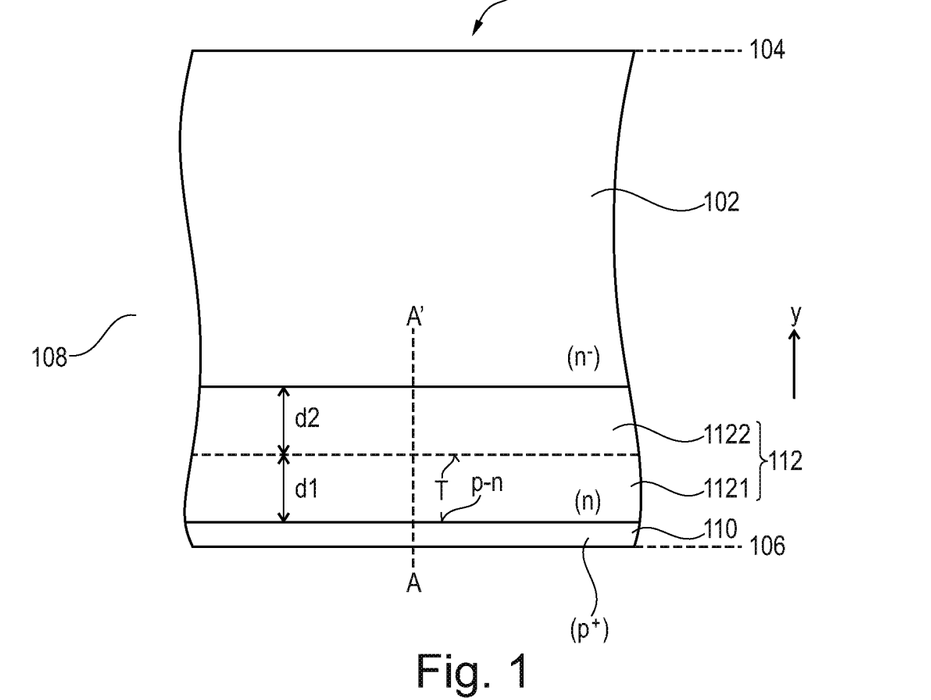
FIG. 1 is a schematic cross-sectional view of a semiconductor device including a field stop region.

FIG. 1 schematically and exemplarily shows a section of a cross-sectional view of a semiconductor device 100, e.g. an IGBT. The schematic graphs of FIGS. 2 to 4 schematically and exemplarily show log-linear concentration profiles of p-doping cp and n-doping cn.

Referring to the schematic cross-sectional view of FIG. 1, the semiconductor device 100 includes an n⁻-doped drift region 102 arranged between a first surface 104 and a second surface 106 of a semiconductor body 108, e.g. a silicon semiconductor substrate. A p⁺-doped first region 110, e.g. a collector or rear side emitter region is arranged at the second surface 106. An n-doped field stop region 112 is arranged between the drift region 102 and the first region 110. The field stop region 112 includes a first sub-region 1121 and a second sub-region 1122. The first region 110 and the first sub-region 1121 are separated by a p-n junction p-n. Hydrogen related donors define an n-type conductivity in the first sub-region 1121 and in the second sub-region 1122.

Figure 2:
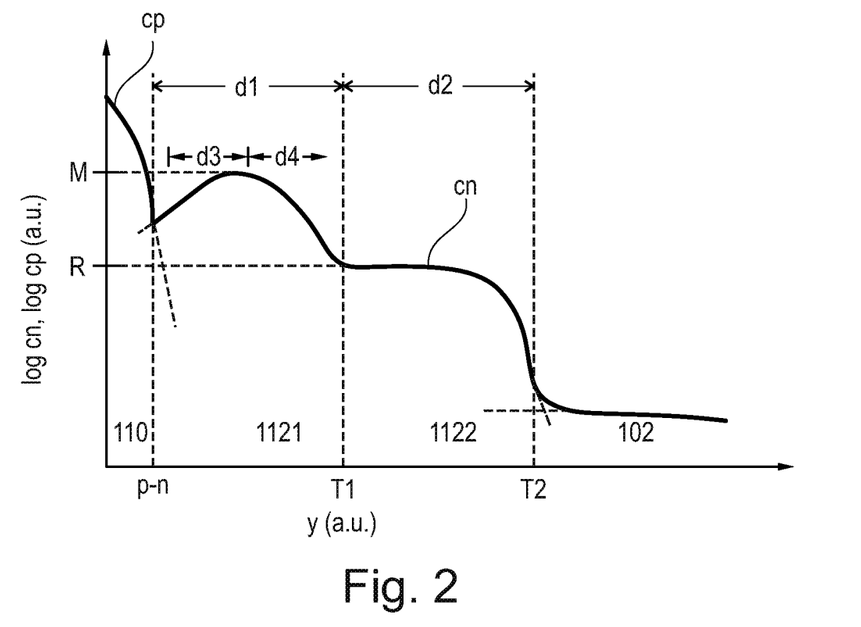
FIGS. 2 to 4 are log-linear graphs for illustrating a profile of doping concentration along line AA' of FIG. 1.
Figure 3:
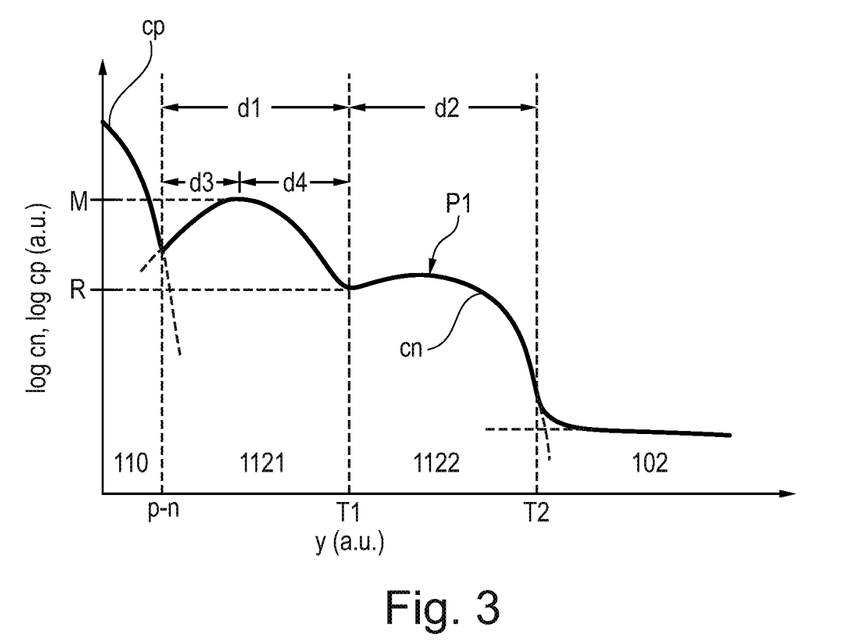
Figure 4:
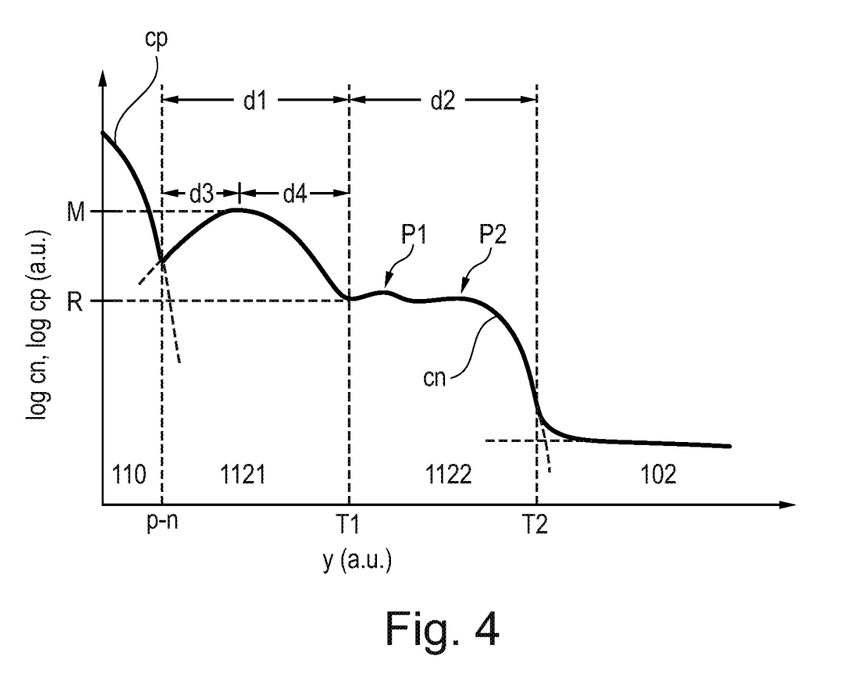

Referring to the schematic graphs of FIGS. 2 to 4 in which the ordinate is a non-linear logarithmic scale of the concentration cn of the hydrogen related donors and the abscissa is a linear scale of a depth along a vertical direction y, a concentration cn of the hydrogen related donors, along a first vertical extent d1 of the first sub-region 1121, steadily increases from the pn-junction p-n to a maximum value M, and steadily decreases from the maximum value to a reference value R at a first transition T1 between the first sub-region 1121 to the second sub-region 1122. A second vertical extent d2 of the second sub-region 1122 ends at a second transition T2 to the drift region 102 where the concentration cn of the hydrogen related donors equals 10% of the reference value R. A maximum concentration value in the second sub-region 1122 is at most 20% larger than the reference value R. The second vertical extent d2 of the second sub-region 1122 may also end at a depth where the concentration of the hydrogen related donors falls below a donor concentration of the drift region 102.

A vertical distance d3 between the p-n junction p-n and a position of the maximum value M may range between 0.5 μm and 4 μm. A vertical distance between the p-n junction p-n and the second transition T2 may range between 6 μm and 20 μm. The vertical distance d3 between the p-n junction p-n and a position of the maximum value M may be smaller than a vertical distance d4 between the position of the maximum value M and the first transition T1.

In the example illustrated in FIG. 2, the vertical profile of the concentration cn of the hydrogen related donors in the second sub-region 1122 steadily decreases from the first transition T1 to the second transition T2. No peaks are present in the second sub-region 1122. The concentration cn of the hydrogen related donors decreases along at least 70% of the second vertical extent d2.

In the example illustrated in FIG. 3, the vertical profile of the concentration cn of the hydrogen related donors in the second sub-region 1122 has a single peak P1.

In the example illustrated in FIG. 4, the vertical profile of the concentration cn of the hydrogen related donors in the second sub-region 1122 has 2 peaks P1, P2.

Figure 5:
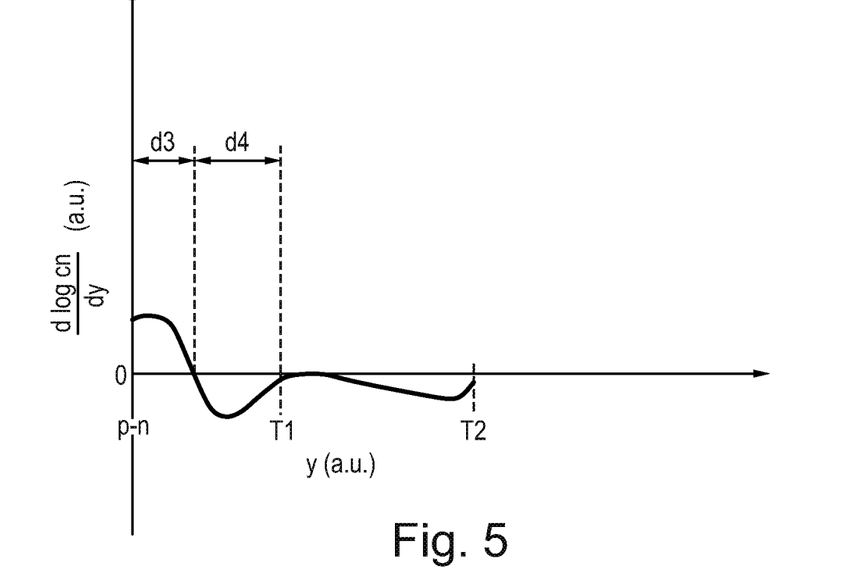
FIGS. 5 to 7 are graphs for illustrating a gradient of the log-linear graphs of FIGS. 2 to 4, respectively.
Figure 6:
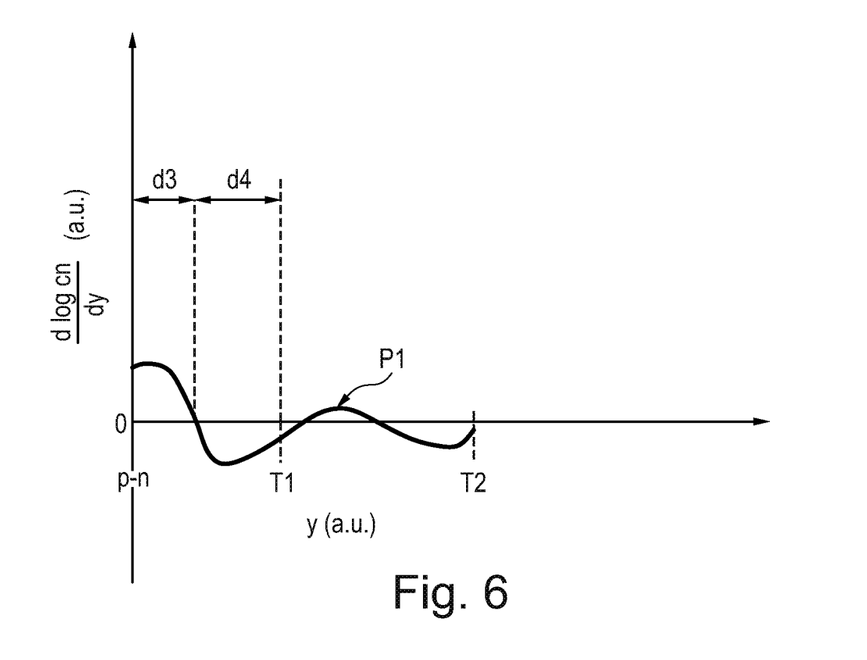
Figure 7:
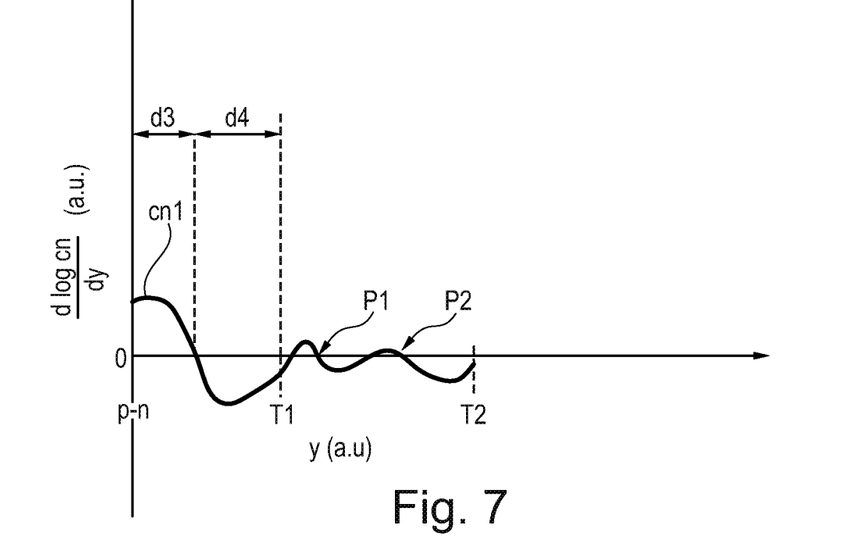

FIGS. 5 to 7 are related to the profiles of FIGS. 2 to 4, respectively, and illustrate a vertical gradient of the log-linear graphs of FIGS. 2 to 4. A maximum value of the vertical gradient of the log-linear graph is at least three times larger in the first sub-region 1121 than in the second sub-region 1122, or is at least three times larger in the first sub-region 1121 than in a first half of the second sub-region 1122 that is located closer to the second surface 106 than a second half. Moreover, a maximum positive value of the vertical gradient of the log-linear graph is at least three times larger in the first sub-region 1121 than in the second sub-region 1122, or is at least three times larger in the first sub-region 1121 than in a first half of the second sub-region 1122 that is located closer to the second surface 106 than a second half.

Figure 8:
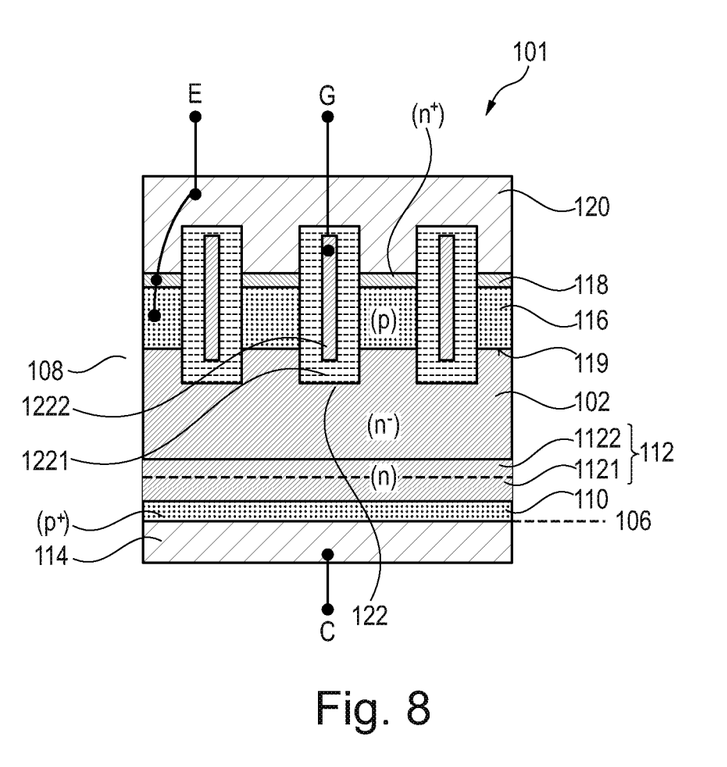
FIG. 8 is a schematic cross-sectional view for illustrating an IGBT including a field stop region as described with reference to FIGS. 2 to 7.

The field stop region 112 described with reference to the examples above may be integrated into an IGBT 101 illustrated in FIG. 8. The IGBT 101 includes a second electrode 114 on the second surface 106. The second electrode 114 is arranged directly adjacent to the first region 110. The second electrode 114 may be a collector electrode at a rear or back side of the IGBT 101. For example, the second electrode 114 may be arranged on a chip carrier, e.g. a lead frame.

The IGBT 101 further includes a p-doped body region 116 and an n⁺-doped source or emitter region 118. The p-doped body region 116 is arranged between the first surface 104 and the drift region 102 and forms a pn-junction 119 with the drift region 102. A first electrode 120, e.g. an emitter electrode E, is arranged at a front or top side of the IGBT 101 and is electrically connected to the source and body region 118, 116. The emitter electrode E may constitute or be part of a wiring area formed over the semiconductor body 108. The wiring area may include one, two, three or even more wiring levels that may include patterned or non-patterned metal layers and interlayer dielectrics arranged between the patterned or non-patterned metal layers. Vias may electrically interconnect the different wiring levels, for example. The IGBT 101 further includes a gate trench structure 122 including a gate dielectric 1121 and a gate electrode 1222. The gate electrode is electrically connected to a gate terminal G.

The examples illustrated in the figures may be combined and may further be combined with other designs of the second region 112 not illustrated in the figures but disclosed as an example herein. By varying different designs of the first and second sub-regions of the field stop region, e.g. geometry, dose of doping, vertical extent, softness or dU/dt or dI/dt-characteristics may be improved by reducing the waviness of the doping profile of the field stop region, thereby enabling access for tuning a the semiconductor device to the applications' need.

The aspects and features mentioned and described together with one or more of the previously described examples and figures, may as well be combined with one or more of the other examples in order to replace a like feature of the other example or in order to additionally introduce the feature to the other example.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
   an n-doped drift region arranged between a first surface and a second surface of a semiconductor body;
   a p-doped first region arranged at the second surface;
   an n-doped field stop region arranged between the n-doped drift region and the p-doped first region, wherein the n-doped field stop region comprises:
   a first sub-region and a second sub-region, wherein a p-n junction separates the p-doped first region and the first sub-region; and
   hydrogen related donors in the first sub-region and in the second sub-region,
   wherein a concentration of the hydrogen related donors, along a first vertical extent of the first sub-region, steadily increases from the pn-junction to a maximum value in the first sub-region, and steadily decreases from the maximum value in the first sub-region to a reference value at a first transition between the first sub-region to the second sub-region,
   wherein a second vertical extent of the second sub-region ends at a second transition to the n-doped drift region where the concentration of the hydrogen related donors equals 10% of the reference value,
   wherein a maximum concentration value of the hydrogen related donors in the second sub-region is at most 20% larger than the reference value, and
   wherein a ratio of the maximum value in the first sub-region to the maximum concentration value of the hydrogen related donors in the second sub-region ranges from 2 to 50.

2. The semiconductor device of claim 1, wherein a vertical profile of the concentration of the hydrogen related donors in the second sub-region has 2 peaks.

3. The semiconductor device of claim 1, wherein a vertical profile of the concentration of the hydrogen related donors in the second sub-region has a single peak.

4. The semiconductor device of claim 1, wherein a vertical profile of the concentration of the hydrogen related donors in the second sub-region steadily decreases from the first transition to the second transition.

5. The semiconductor device of claim 1, wherein the first vertical extent ranges between 50% and 200% of the second vertical extent.

6. The semiconductor device of claim 1, wherein a vertical distance between the p-n junction and a position of the maximum value ranges between 0.5 µm and 4 µm.

7. The semiconductor device of claim 1, wherein a vertical distance between the p-n junction and the second transition ranges between 6 µm and 20 µm.

8. The semiconductor device of claim 1, wherein a vertical distance between the p-n junction and a position of the maximum value is smaller than a vertical distance between the position of the maximum value and the first transition.

9. The semiconductor device of claim 1, wherein a ratio between a concentration of donors based on $C_iO_iH_n$ complexes to a total donor concentration along at least 80% of the second vertical extent is smaller than 0.1.

10. The semiconductor device of claim 1, wherein a vertical extension of the first sub-region equals a value between 50% to 200% of a vertical extension of the second sub-region.

11. The semiconductor device of claim 1, wherein a ratio between a vertical extension of the first sub-region and a vertical extension of the second sub-region equals a value between 0.7 and 1.3.

12. A semiconductor device, comprising:
    an n-doped drift region arranged between a first surface and a second surface of a semiconductor body;
    a p-doped first region arranged at the second surface;
    an n-doped field stop region arranged between the n-doped drift region and the p-doped first region, wherein the n-doped field stop region comprises:
    a first sub-region and a second sub-region, wherein a p-n junction separates the p-doped first region and the first sub-region; and
    hydrogen related donors in the first sub-region and in the second sub-region,
    wherein a concentration of the hydrogen related donors, along a first vertical extent of the first sub-region, steadily increases from the pn-junction to a maximum value in the first sub-region, and steadily decreases from the maximum value in the first sub-region to a reference value at a first transition between the first sub-region to the second sub-region,
    wherein a second vertical extent of the second sub-region ends at a second transition to the n-doped drift region where the concentration of the hydrogen related donors equals 10% of the reference value,
    wherein a maximum value of a vertical gradient of a log-linear graph in which the ordinate is a non-linear logarithmic scale of the concentration of the hydrogen related donors and the abscissa is a linear scale of a depth along a vertical direction, is at least three times larger in the first sub-region than in the second sub-region, and
    wherein a ratio of the maximum value in the first sub-region to a maximum concentration value of the hydrogen related donors in the second sub-region ranges from 2 to 50.

13. The semiconductor device of claim 12, wherein an average value of a vertical gradient of the log-linear graph from the pn-junction to the maximum value in the first sub-region is at least three times larger than from the first transition to a peak in the second sub-region.

14. The semiconductor device of claim 13, wherein:
the concentration of the hydrogen related donors decreases along at least 70% of the second vertical extent; and/or
all rising edges of the vertical gradient of the log-linear graph within the second sub-region are smaller than $2 \times 10^{13}$ cm$^{-3}$/100 nm.

15. The semiconductor device of claim 12, wherein a vertical profile of the concentration of the hydrogen related donors in the second sub-region has 2 peaks.

16. The semiconductor device of claim 12, wherein a vertical profile of the concentration of the hydrogen related donors in the second sub-region has a single peak.

17. The semiconductor device of claim 12, wherein a vertical profile of the concentration of the hydrogen related donors in the second sub-region steadily decreases from the first transition to the second transition.

18. The semiconductor device of claim 12, wherein the first vertical extent ranges between 50% and 200% of the second vertical extent.

19. The semiconductor device of claim 12, wherein a vertical distance between the p-n junction and a position of the maximum value ranges between 0.5 µm and 4 µm.

20. The semiconductor device of claim 12, wherein a vertical distance between the p-n junction and the second transition ranges between 6 µm and 20 µm.

21. The semiconductor device of claim 12, wherein a vertical distance between the p-n junction and a position of the maximum value is smaller than a vertical distance between the position of the maximum value and the first transition.

22. The semiconductor device of claim 12, wherein a ratio between a concentration of donors based on $C_iO_jH_n$ complexes to a total donor concentration along at least 80% of the second vertical extent is smaller than 0.1.

23. The semiconductor device of claim 12, wherein a vertical extension of the first sub-region equals a value between 50% to 200% of a vertical extension of the second sub-region.

24. The semiconductor device of claim 12, wherein a ratio between a vertical extension of the first sub-region and a vertical extension of the second sub-region equals a value between 0.7 and 1.3.

* * * * *